(12) United States Patent  (10) Patent No.: US 7,606,275 B2
Kunimasa  (45) Date of Patent: Oct. 20, 2009

(54) SEMICONDUCTOR LASER DEVICE HAVING INCOMPLETE BONDING REGION AND ELECTRONIC EQUIPMENT

(75) Inventor: Fumie Kunimasa, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 10 days.

(21) Appl. No.: 11/905,561

(22) Filed: Oct. 2, 2007

(65) Prior Publication Data

US 2008/0084903 A1   Apr. 10, 2008

(30) Foreign Application Priority Data

Oct. 4, 2006  (JP) ............................ P2006-272922

(51) Int. Cl.
*H01S 3/04* (2006.01)
(52) U.S. Cl. .................. 372/34; 372/36; 372/43.01
(58) Field of Classification Search ............... 372/36, 372/34, 43.01
See application file for complete search history.

(56) References Cited

U.S. PATENT DOCUMENTS 5,729,561 A * 3/1998 Hironaka ............... 372/36

6,967,980 B2 * 11/2005 Kawai .................... 372/43.01

FOREIGN PATENT DOCUMENTS

| JP | 3461632 | 8/2003 |
| JP | 2004-096062 | 3/2004 |

* cited by examiner

*Primary Examiner*—Minsun Harvey
*Assistant Examiner*—Kinam Park
(74) *Attorney, Agent, or Firm*—Nixon & Vanderhye P.C.

(57) ABSTRACT

There is provided a semiconductor laser device capable of reducing stress occurring to a semiconductor laser element so that a life of the semiconductor laser device can be prolonged. In this semiconductor laser device, a solder layer 114 is absent over a first region R1 ranging to a specified length L1 in a perpendicular direction X from a center line J1 of a light-emitting region 150 toward both sides of the perpendicular direction X. That is, the first region R1 over which the light-emitting region 150 is present serves as an incomplete bonding region between the solder layer 114 of the semiconductor laser element 100 and a heat sink 200. Thus, stress given to the light-emitting region 150 due to differences in coefficient of thermal expansion among the semiconductor laser element 100, the solder layer 114 and the heat sink 200 during operation is reduced.

18 Claims, 5 Drawing Sheets

SEMICONDUCTOR LASER DEVICE HAVING INCOMPLETE BONDING REGION AND ELECTRONIC EQUIPMENT

This nonprovisional application claims priority under 35 U.S.C. §119(a) on Patent Application No. 2006-272922 filed in Japan on Oct. 4, 2006, the entire contents of which are hereby incorporated by reference.

BACKGROUND

The disclosed technology relates to a semiconductor laser device and electronic equipment.

In a semiconductor laser device, conventionally, a heat sink is used for prevention of deterioration in emission efficiency, damage of a semiconductor laser element or the like due to temperature increases of the semiconductor laser element during operation of the laser. That is, a heat sink is bonded to a lower face of the semiconductor laser element via a solder layer so that heat generated during the operation is radiated efficiently from the heat sink.

However, stress occurs due to a difference in coefficient of thermal expansion between the semiconductor laser element and the heat sink, causing internal stress to occur to the semiconductor laser element. As a result, there is a problem that strain occurs to semiconductor layers forming the semiconductor laser element.

In view of such a problem, there has been proposed a semiconductor laser device of a prior art which is intended to reduce the internal stress of the semiconductor laser element depending on the electrode configuration of the semiconductor laser element (JP 3461632 B).

Figure 3:
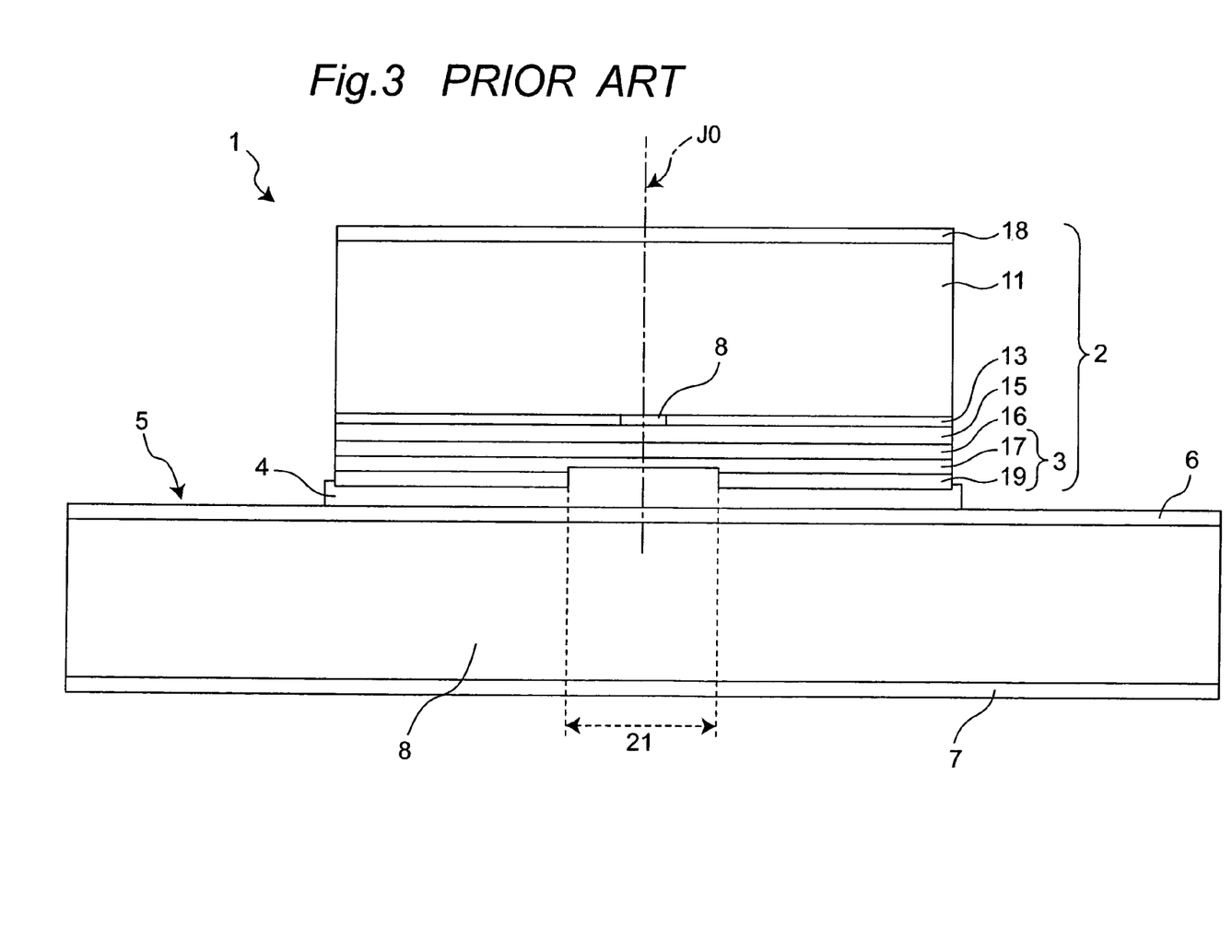
FIG. 3 is a view showing a semiconductor laser device according to a prior art.

This prior-art semiconductor laser device 1, as shown in a sectional view of FIG. 3, has a semiconductor laser element 2, a solder layer 4 and a heat sink 5. The semiconductor laser element 2 is mounted on the heat sink 5 via the solder layer 4. The heat sink 5 has a heat sink member 8, an upper-face electrode 6 formed on one surface of the heat sink member 8 as viewed in its thicknesswise direction, and a lower-face electrode 7 formed on the other surface in the thicknesswise direction. The solder layer 4 is stacked on the upper-face electrode 6. Then, the semiconductor laser element 2 is stacked on the solder layer 4, to which an alloyed layer 19 forming a lower-face electrode 3 of the semiconductor laser element 2 is opposed.

In this semiconductor laser element 2, an active layer 13, a cap layer 15, an ohmic electrode layer 16 and a non-alloyed layer 17 are stacked in this order on one thicknesswise surface of a substrate 11. Meanwhile, an upper-face electrode 18 of the semiconductor laser element 2 is formed on the other thicknesswise surface of the substrate 11. Then, the alloyed layer 19 is stacked partly on the non-alloyed layer 17. The alloyed layer 19 and the non-alloyed layer 17 constitute the lower-face electrode 3.

As shown in FIG. 3, over a region 21 ranging to a specified length from a center line J0 of a light-emitting region 8 of the semiconductor laser element 2 in a perpendicular direction, perpendicular to a direction in which the light-emitting region 8 of the semiconductor laser element 2 extends in a stripe form (i.e. to a direction perpendicular to the drawing sheet) as well as perpendicular to the thicknesswise direction of the light-emitting region 8, toward both sides of the perpendicular direction, the alloyed layer 19 is absent and the non-alloyed electrode layer 17 is present. That is, in the region 21, the lower-face electrode 3 of the semiconductor laser element 2 is not alloyed with the solder layer 4, with the non-alloyed layer 17 confronting the solder layer 4. Meanwhile, in regions which are more distant from the center line J0 in the perpendicular direction than the region 21, the lower-face electrode 3 is alloyed with the solder layer 4, with the alloyed electrode layer 19 bonded to the solder layer 4.

When the semiconductor laser element 2 is thermally fused with the heat sink 5 via a solder material, the alloyed layer 19 of FIG. 3 comes to be alloyed with the solder material stacked on the heat sink 5 so as to be strongly bonded to the solder layer 4. In contrast to this, the non-alloyed layer 17 does not come to be alloyed with the solder material stacked on the heat sink 5, thus not being strongly bonded to the solder layer 4.

As a consequence, the internal stress is reduced in the non-alloyed layer 17 more than in the alloyed layer 19. Then, since the light-emitting region 8 is formed in a non-alloyed region, where the non-alloyed layer 17 is in contact with the solder layer 4, internal stress applied to the light-emitting region 8 can be reduced so that the semiconductor laser device 1 can be enhanced in its reliability.

In another aspect of the prior-art semiconductor laser device 1, since the non-alloyed layer 17 is formed just under the light-emitting region 8 of the semiconductor laser element 2, stress occurs to the light-emitting region 8 due to differences in coefficient of thermal expansion between the non-alloyed layer 17 and the ohmic electrode layer (alloyed layer 19) or the active region (light-emitting region 8), resulting in another problem that the reliability enhancement effect cannot be sufficiently obtained.

SUMMARY

In an aspect, a semiconductor laser device capable of reducing the stress occurring to the semiconductor laser element is provided so that the life of the semiconductor laser device can be prolonged.

According to an example embodiment the present invention, a semiconductor laser device comprises:

a semiconductor laser element in which a striped light-emitting region is formed; and a heat sink bonded to the semiconductor laser element, wherein the semiconductor laser element has:

a conductive electrode opposed to the heat sink;

a solder layer stacked on the conductive electrode, the solder layer being absent over a first region ranging to a specified length from a center line of the light-emitting region in a perpendicular direction, perpendicular to an extensional direction in which the light-emitting region extends in a stripe form as well as perpendicular to a thicknesswise direction of the light-emitting region, toward both sides of the perpendicular direction, while being present over second regions more distant from the center line toward both sides of the perpendicular direction than the first region; and a bonding portion at which the solder layer and a metal layer of the heat sink are alloyed with each other.

The solder layer can be absent over the first region ranging to a specified length from the center line of the light-emitting region toward both sides of the perpendicular direction. That is, the first region over which the light-emitting region is present serves as an incomplete bonding region between the solder layer of the semiconductor laser element and the heat sink. Thus, stress given to the light-emitting region due to differences in coefficient of thermal expansion among the semiconductor laser element, the solder layer and the heat sink during operation can be reduced. Consequently, strain of the light-emitting region can be suppressed.

Also, in this case, since the solder layer formed in the semiconductor laser element is bonded in contact with the heat sink, the semiconductor laser element can be mounted and fused onto the heat sink on which the solder layer is not formed. Thus, since it becomes unnecessary to do alignment between the solder layer and the semiconductor laser as would be involved in the bonding of the semiconductor laser to the heat sink having the solder layer formed thereon, the bonding of the semiconductor laser element and the heat sink to each other can be easily achieved.

In one embodiment, in the first region, no solder is present between the conductive electrode of the semiconductor laser element and the metal layer of the heat sink and moreover the conductive electrode and the metal layer are unfused with each other.

In this embodiment, in the first region in which the light-emitting region is present, no solder is present, and the semiconductor laser element and the heat sink are not fused with each other. Therefore, the stress applied to the light-emitting region can be further reduced, so that strain of the light-emitting region can be further suppressed.

In one embodiment, in the first region, a void is formed between the conductive electrode of the semiconductor laser element and the heat sink.

In this embodiment, since the void is formed between the semiconductor laser element and the heat sink, internal stress applied to the light-emitting region of the semiconductor laser element can be further reduced, so that the service life of the semiconductor laser device can be further improved.

In one embodiment, in the conductive electrode, its junction portion with the solder layer is alloyed with the solder layer in the second regions.

In this embodiment, since the junction portion between the conductive electrode of the semiconductor laser element and the solder layer is alloyed with each other so as to be completely bonded together, the heat radiation efficiency of the junction portion is improved. Thus, increases in operating current at high temperatures can be suppressed, so that high-temperature reliability of the device can be improved.

In one embodiment, the conductive electrode includes a topmost layer made from a material containing Au, the solder layer is made from a solder material composed of AuSn or SnPb, and the metal layer of the heat sink includes a topmost layer made from a material containing Au.

In this embodiment, in the second regions on both sides of the first region over which the light-emitting region is present, the solder layer allows an alloying region with the conductive electrode to be easily formed from a solder material composed of AuSn or SnPb and a material containing Au. Also, the solder layer allows alloying regions (bonding portions) with the metal layer of the heat sink to be easily formed from the solder material and a material containing Au.

In one embodiment, the solder layer is made by electroplating from a solder material composed of AuSn.

In this embodiment, by forming AuSn of the solder layer by electroplating, the solder layer can be easily formed at the conductive electrode in the second regions. Further, the solder layer composed of AuSn can be easily formed to a desired thickness.

Electronic equipment according to one embodiment includes the above-described semiconductor laser device. Therefore, electronic equipment having high reliability and prolonged service life can be realized.

In one or more embodiment(s), the first region in which the light-emitting region is present serves as an incomplete bonding region between the solder layer of the semiconductor laser element and the heat sink. Thus, stress given to the light-emitting region due to differences in coefficient of thermal expansion among the semiconductor laser element, the solder layer and the heat sink during operation can be reduced. Therefore, strain of the light-emitting region can be suppressed, and the service life of the device can be prolonged.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein.

DETAILED DESCRIPTION

Hereinbelow, the present invention will be described in detail by way of non-limiting example embodiments thereof illustrated in the accompanying drawings.

First Embodiment

Figure 1A:
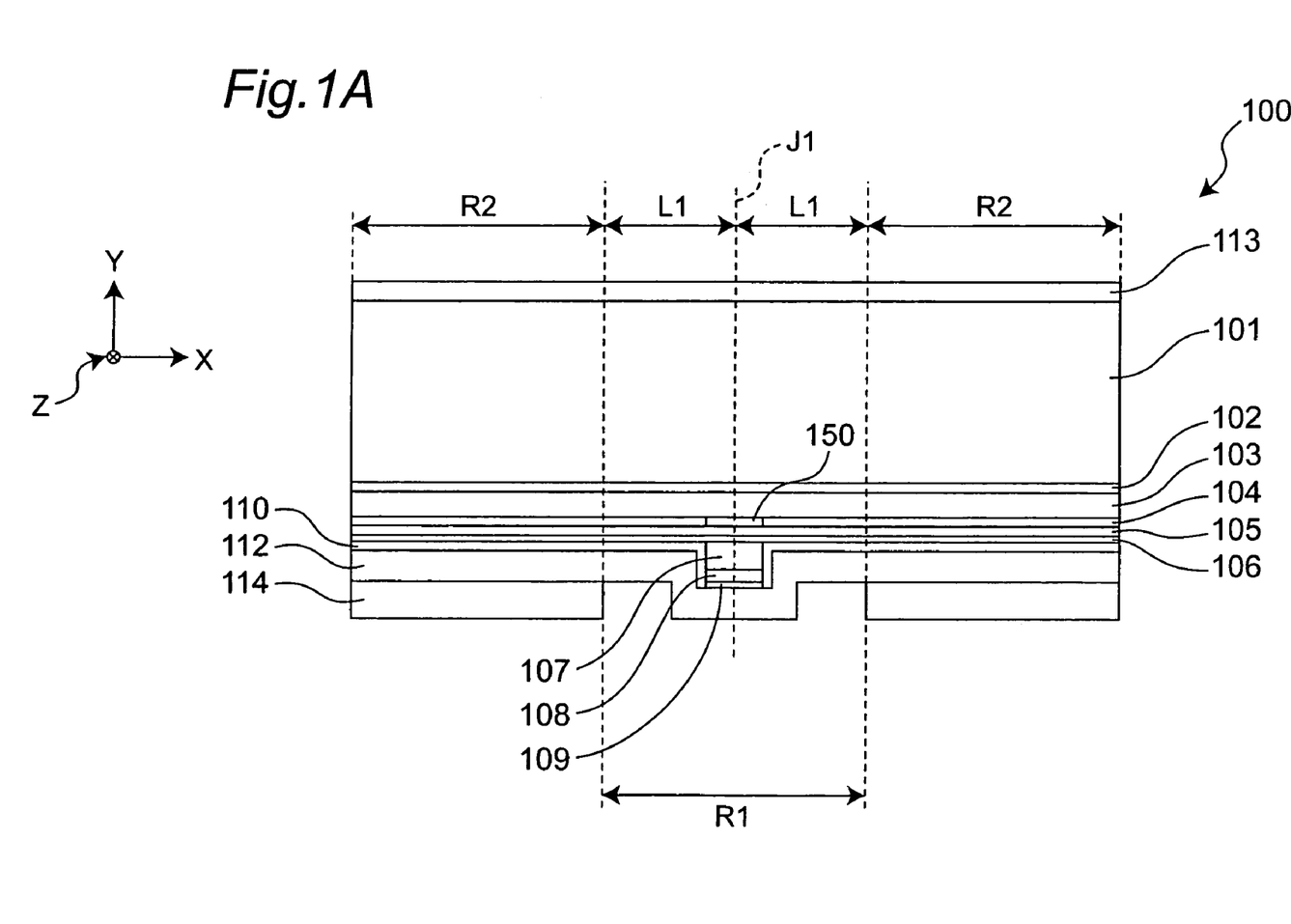
FIG. 1A is a sectional view showing a semiconductor laser element 100 of a semiconductor laser device according to a first embodiment of the present invention.

FIG. 1A shows a cross section of a semiconductor laser element 100 in a first example embodiment of the semiconductor laser device. In this first embodiment, the semiconductor laser element 100 has a ridge structure. The semiconductor laser element 100 includes an n-GaAs substrate 101, an n-GaInP buffer layer 102, an n-AlGaInP clad layer 103, a quantum well active layer 104, a p-AlGaInP first clad layer 105, an etching stop layer 106, a p-AlGaInP second clad layer 107, a p-GaAs contact layer 108, a p-side contact electrode 109, a dielectric film 110, a plated metal layer 112 as a conductive electrode, and an n electrode 113.

Also, the semiconductor laser element 100 has a light-emitting region 150 which extends in a stripe form along a direction vertical to the drawing sheet of FIG. 1A. The semiconductor laser element 100 also has a solder layer 114 stacked on the plated metal layer 112.

The solder layer 114 is absent over a first region R1 ranging to a specified length L1 from a center line J1 of the light-emitting region 150 in a perpendicular direction X, perpendicular to an extensional direction Z in which the light-emitting region 150 extends in a stripe form as well as perpendicular to a thicknesswise direction Y of the light-emitting region 150, toward both sides of the perpendicular direction X, while the solder layer 114 is present over second regions R2 more distant from the center line J1 toward both sides of the perpendicular direction X than the first region R1. Although the first region R1 is assumed to range to an equal specified length L1 from the center line J1 toward both sides of the perpendicular direction X in this embodiment, yet the first region R1 may also be so set as to range to different lengths toward the two sides, respectively, of the perpendicular direction X from the center line J1.

Figure 1B:
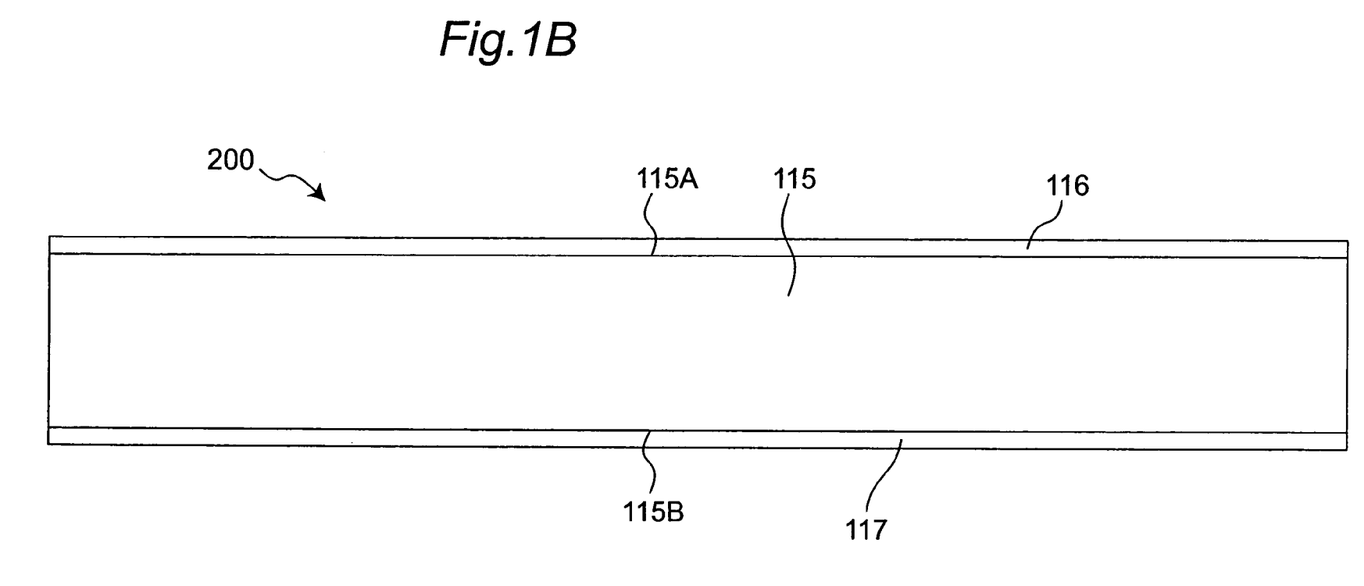
FIG. 1B is a sectional view showing a heat sink 200 of the first embodiment.

Next, FIG. 1B shows a heat sink 200 on which the semiconductor laser element 100 is to be mounted. The heat sink 200 has a heat sink member 115, and a top-face electrode 116 is formed on a surface 115A of the heat sink member 115 confronting the semiconductor laser element 100. The top-face electrode 116, which is single- or multi-layered, has a topmost layer formed from a material containing Au. A rear-face electrode 117 is formed on a surface 115B of the heat sink member 115. This rear-face electrode 117, however, does not necessarily need to be formed.

Figure 1C:
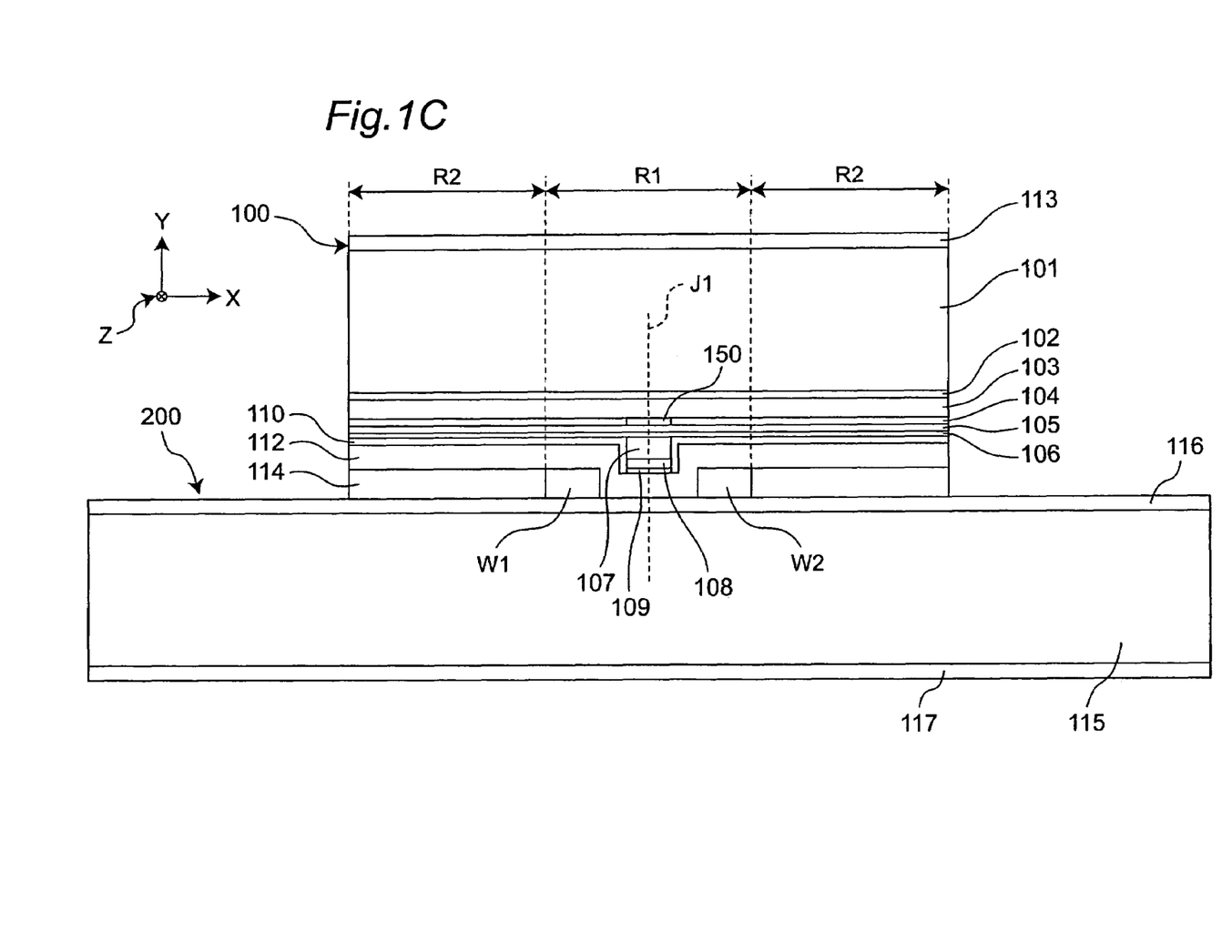
FIG. 1C is a sectional view showing the semiconductor laser device of the first embodiment.

As shown in FIG. 1C, in this semiconductor laser device of the first embodiment, the semiconductor laser element 100 and the heat sink 200 are bonded to each other via the solder layer 114 formed on the plated metal layer 112 of the semiconductor laser element 100. At the second regions R2 more distant from the center line J1 toward both sides of the perpendicular direction X than the first region R1, this semiconductor laser device includes bonding portions (not shown) at which the metal layer 116 of the heat sink 200 and the solder layer 114 are alloyed with each other.

In this case, the solder layer 114 is absent over the first region R1 ranging to the specified length L1 from the center line J1 of the light-emitting region 150 in the perpendicular direction X of the light-emitting region 150 toward both sides of the perpendicular direction X. That is, in the first region R1 where the light-emitting region 150 is present, the solder layer 114 of the semiconductor laser element 100 and the heat sink 200 are not fused together. Accordingly, stress given to the light-emitting region 150 due to differences in coefficient of thermal expansion among the semiconductor laser element 100, the solder layer 114 and the heat sink 200 during operation can be reduced. Thus, according to this semiconductor laser device, strain of the light-emitting region 150 can be suppressed and the device serve life can be prolonged.

Also, according to the first embodiment, the solder layer 114 formed in the semiconductor laser element 100 is bonded to the heat sink 200. That is, the semiconductor laser element 100 can be mounted and fused onto the heat sink 200 having no solder layer formed therein. Thus, since it becomes unnecessary to do alignment between the solder layer and the semiconductor laser as would be involved in the bonding of the semiconductor laser to the heat sink having the solder layer formed therein, the bonding of the semiconductor laser element 100 and the heat sink 200 to each other can be easily achieved.

Further, according to the first embodiment, in the first region R1, voids W1, W2 are formed between the plated metal layer 112 of the semiconductor laser element 100 and the heat sink 200. These voids W1, W2 are formed on both sides of the X direction in the ridge structure constructed of the second clad layer 107, the contact layer 108 and the p-side contact electrode 109. Thus, by the formation of the voids W1, W2 between the semiconductor laser element 100 and the heat sink 200, internal stress applied to the light-emitting region 150 of the semiconductor laser element 100 can be further reduced, so that the life of the semiconductor laser device can be further improved.

Next, manufacturing process of the semiconductor laser device in this first embodiment is described below.

First, on an n-GaAs substrate 101 are crystal grown by epitaxial growth, in sequence, an n-GaInP buffer layer 102, an n-AlGaInP clad layer 103, a quantum well active layer 104, a p-AlGaInP first clad layer 105, an etching stop layer 106, a p-AlGaInP second clad layer 107, and a p-GaAs contact layer 108.

Next, by wet etching, the p-GaAs contact layer 108 and the p-AlGaInP second clad layer 107 are etched to form a ridge stripe serving as an optical waveguide and current path. This ridge stripe is formed so as to have a predetermined X-directional width. For example, the ridge stripe width is chosen from within a range of 1.0 μm to 5.0 μm. The ridge stripe may be formed by combination of dry etching and wet etching, or by only dry etching.

Next, a dielectric film 110 (e.g., $SiO_2$, SiNx, $Al_2O_3$, etc.) is deposited at an upper portion of the semiconductor laser element except an upper portion of the ridge stripe, while a p-side contact electrode 109 is formed at the upper portion of the ridge stripe.

Next, Au to make a plated metal layer 112 is formed all over the wafer so as to be entirely uniform in layer thickness. This Au process is carried out so that the layer thickness of the plated metal layer 112 becomes 0.5 μm to 5.0 μm as an example.

Thereafter, a solder layer 114 is formed on the plated metal layer 112 except the first region R1 ranging to a predetermined length L1 from the center line J1 of the light-emitting region 150 in the X direction. The length L1 is selected so as to be within 2 μm to 20 μm as an example. In this first embodiment, AuSn- or PbSn-related solder is used as the solder material for forming the solder layer 114, which is a solder layer having a thickness of 0.3 μm to 5.0 μm and having a component ratio of, for example, Au(80%)-Sn(20%), or Sn(95%)-Pb(5%), or the like. The solder layer 114 is formed by thick film formation, or electroplating that allows an easier implementation of patterning, as an example.

Thereafter, the n-GaAs substrate 101 is polished from the rear face side so as to be thinned to form an n electrode 113, and then divided into chips, by which the semiconductor laser element 100 shown in FIG. 1A is fabricated.

Then, the semiconductor laser element 100 is pressed in contact onto the top-face electrode 116 of the heat sink 200, and the temperature is increased until the solder layer 114 is melted, by which the solder layer 114 and the top-face electrode 116 on the heat sink 200, as well as the solder layer 114 and the plated metal layer 112 of the semiconductor laser element 100, are alloyed with each other (see FIG. 1C).

As a result, the plated metal layer 112 and the solder layer 114 are alloyed with each other in the second regions R2 which are more distant than the first region R1 ranging to the predetermined length L1 from the center line J1 of the light-emitting region 150 toward both sides of the perpendicular direction X. Also in the second regions R2, the solder layer 114 and the top-face electrode 116 on the heat sink 200 are alloyed with each other. By this alloying, bonding portions (not shown) by alloying are enhanced in heat radiation efficiency, so that increases in operating current at high temperatures can be suppressed and the device reliability at high temperatures can be enhanced.

As shown above, according to the semiconductor laser device of this first embodiment, since internal stress applied to the light-emitting region of the laser element can be reduced as compared with the conventional counterpart, the average life of the semiconductor laser device in high-temperature operations can be improved from 5000 hours to 6000 hours as an example, enabling a life prolongation.

Second Embodiment

Figure 2:
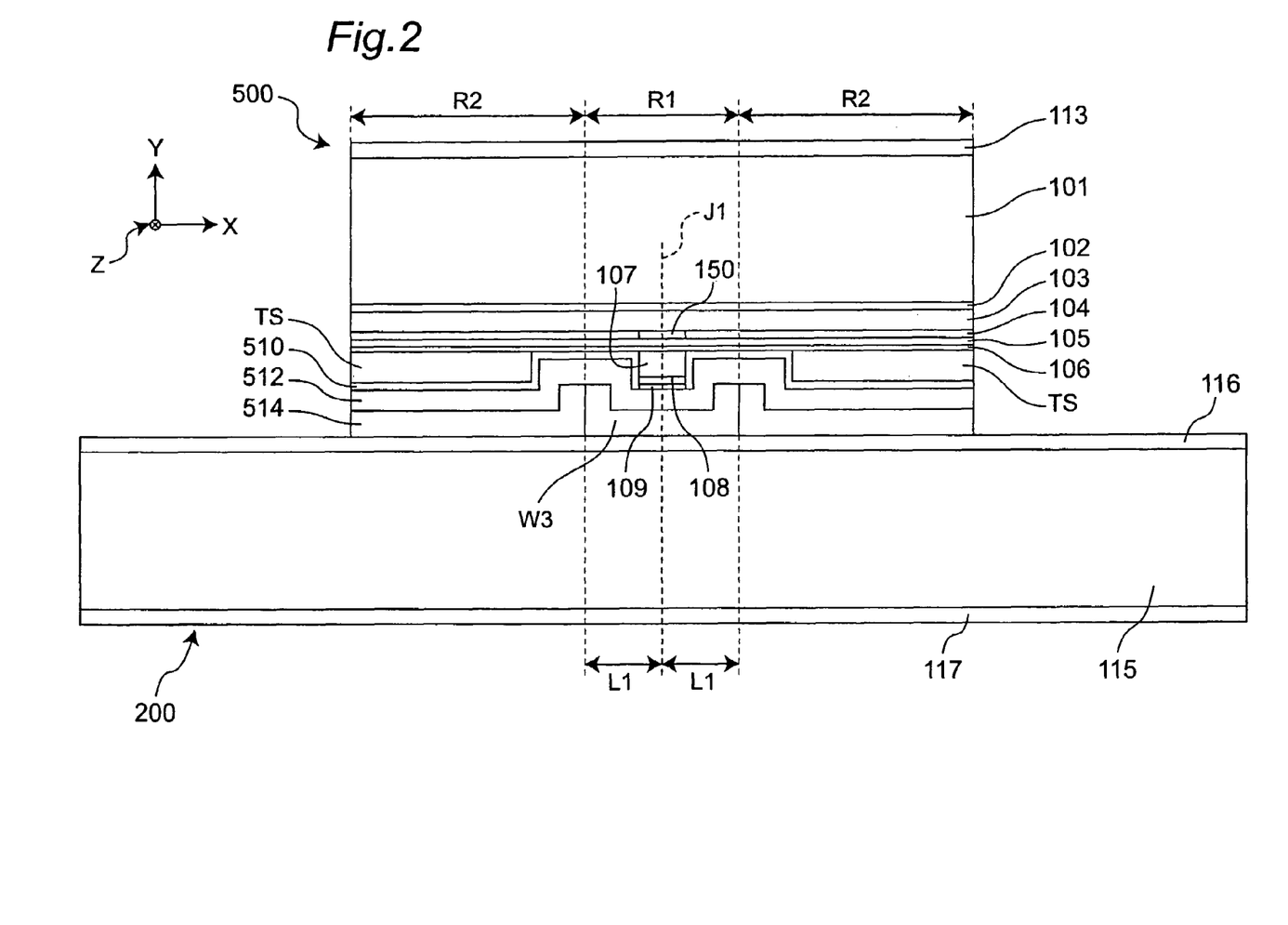
FIG. 2 is a sectional view showing a semiconductor laser device according to a second embodiment of the invention.

Next, FIG. 2 shows a second example embodiment of the semiconductor laser device. This second embodiment differs from the foregoing first embodiment in that a semiconductor laser element 500 is included instead of the semiconductor laser element 100 of FIG. 1C. Therefore, like component members in conjunction with the foregoing first embodiment are designated by like reference numerals in this second embodiment, and its differences from the first embodiment will be described principally.

In the foregoing first embodiment, the second clad layer 107 is left only in regions that form the ridge stripe. In this second embodiment, however, as shown in FIG. 2, not only the second clad layer 107 to form the ridge stripe but also a terrace layer TS distant by a specified length (e.g., 5 μm-100 μm) from the second clad layer 107 toward both sides of the X direction are included.

More specifically, in this second embodiment, regions ranging to a specified length (e.g., 5 μm-100 μm) from an X-directional end of the second clad layer 107 forming the ridge stripe toward both sides of the X direction are etched in manufacturing process, by which not only the second clad layer 107 but also the terrace layer TS are left.

That is, in the second embodiment, a terrace layer TS which is distant by a specified length (e.g., 5 μm-100 μm) in the X direction from the ridge stripe formed by the second clad layer 107 and which is equal in height to the ridge stripe is provided. According to the second embodiment, it can be avoided that only the ridge stripe formed by the second clad layer 107 may be protruded during the fabrication process of the semiconductor laser element 500, thus making it possible to prevent the ridge stripe from being damaged during the fabrication process, so that the manufacturing yield of the semiconductor laser element can be improved.

Then, in this second embodiment, a dielectric film 510 is deposited over regions of the semiconductor laser element 500 except the top face of the second clad layer 107 forming the ridge stripe.

In the manufacturing process of this second embodiment, after the dielectric film 510 is deposited, Au to make a plated metal layer 512 is formed. In this step, the plated metal layer 512 is formed so as to have a layer thickness of 0.5 μm to 5.0 μm as an example. Further, a solder layer 514 is formed on the plated metal layer 512 except the first region R1 ranging to the specified length L1 from the center line J1 of the light-emitting region 150 toward both sides of the X direction. The length L1 is chosen from within a range of 2 μm to 20 μm as an example, as in the foregoing first embodiment.

Thereafter, the n-GaAs substrate 101 is polished from the rear face side so as to be thinned to form an n electrode 113, and then divided into chips to form semiconductor laser elements 500. Then, the semiconductor laser element 500 is pressed in contact onto the top-face electrode 116 of the heat sink 200, and the temperature is increased until the solder layer 514 is melted, by which the solder layer 514 and the top-face electrode 116 of the heat sink 200, as well as the solder layer 514 and the plated metal layer 512 of the semiconductor laser element 500, are alloyed with each other.

This process of bonding between the semiconductor laser element 500 and the heat sink 200 is so performed that the solder is absent and a void W3 is formed between the plated metal layer 512 and the top-face electrode 116 of the heat sink 200 all over the first region R1 ranging to the predetermined length L1 from the center line J1 of the light-emitting region 150 toward both sides of the X direction. By the formation of the void W3, internal stress applied to the light-emitting region 150 can be further reduced, so that a semiconductor laser device further improved in service life can be obtained.

Embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser device comprising:
   a semiconductor laser element in which a striped light-emitting region is formed; and
   a heat sink bonded to the semiconductor laser element,
   wherein the semiconductor laser element includes:
   a clad layer, a contact layer, and a contact electrode all formed in a ridge structure;
   a conductive electrode opposed to the heat sink;
   a solder layer stacked on the conductive electrode, the solder layer being absent over a first region ranging to a specified length from a center line of the light-emitting region in a perpendicular direction, perpendicular to an extensional direction in which the light-emitting region extends in a stripe form as well as perpendicular to a thicknesswise direction of the light-emitting region, toward both sides of the perpendicular direction, while being present over second regions more distant from the center line toward both sides of the perpendicular direction than the first region; and
   a bonding portion at which the solder layer and a metal layer of the heat sink are alloyed with each other,
   wherein the ridge structure is formed within a portion of the first region.

2. The semiconductor laser device as claimed in claim 1, wherein in the first region, no solder is present between the conductive electrode of the semiconductor laser element and the metal layer of the heat sink and moreover the conductive electrode and the metal layer are unfused with each other.

3. The semiconductor laser device as claimed in claim 1, wherein in the first region, a void is formed between the conductive electrode of the semiconductor laser element and the heat sink.

4. The semiconductor laser device as claimed in claim 1, wherein in the conductive electrode, its junction portion with the solder layer is alloyed with the solder layer in the second regions.

5. The semiconductor laser device as claimed in claim 1, wherein the conductive electrode includes a topmost layer made from a material containing Au, the solder layer is made from a solder material composed of AuSn or SnPb, and the metal layer of the heat sink includes a topmost layer made from a material containing Au.

6. The semiconductor laser device as claimed in claim 5, wherein the solder layer is made by electroplating from a solder material composed of AuSn.

7. Electronic equipment including the semiconductor laser device as defined in claim 1.

8. The semiconductor laser device as claimed in claim 1, wherein the conductive electrode of the semiconductor element conforms a shape of the ridge structure within the first region.

9. The semiconductor laser device as claimed in claim 1, wherein the conductive electrode of the semiconductor element conforms contacts the heat sink within the first region.

10. A method of forming a semiconductor laser device, the method comprising:
    forming a semiconductor laser element including forming a striped light-emitting region; and
    bonding a heat sink to the semiconductor laser element,
    wherein the step of forming the semiconductor element comprises:
    forming a clad layer, a contact layer, and a contact electrode all formed in a ridge structure;
    forming a conductive electrode opposed to the heat sink;

forming a solder layer stacked on the conductive electrode, the solder layer being absent over a first region ranging to a specified length from a center line of the light-emitting region in a perpendicular direction, perpendicular to an extensional direction in which the light-emitting region extends in a stripe form as well as perpendicular to a thicknesswise direction of the light-emitting region, toward both sides of the perpendicular direction, while being present over second regions more distant from the center line toward both sides of the perpendicular direction than the first region; and forming a bonding portion at which the solder layer and a metal layer of the heat sink are alloyed with each other, wherein the ridge structure is formed within a portion of the first region.

11. The method as claimed in claim 10, wherein the step of bonding the heat sink to the semiconductor laser element is performed after the step of forming the solder layer stocked on the conductive electrode.

12. The method as claimed in claim 10, wherein step of forming the solder layer comprises forming the solder layer such that in the first region, no solder is present between the conductive electrode of the semiconductor laser element and the metal layer of the heat sink and such that the conductive electrode and the metal layer are unfused with each other.

13. The method as claimed in claim 10, further comprising forming a void in the first region between the conductive electrode of the semiconductor laser element and the heat sink.

14. The method as claimed in claim 10, wherein the step of forming the solder layer comprises soldering such that in the conductive electrode, its junction portion with the solder layer is alloyed with the solder layer in the second regions.

15. The method as claimed in claim 10, wherein the conductive electrode includes a topmost layer made from a material containing Au, the solder layer is made from a solder material composed of AuSn or SnPb, and a metal layer of the heat sink includes a topmost layer made from a material containing Au.

16. The method as claimed in claim 15, wherein the solder layer is made by electroplating from a solder material composed of AuSn.

17. The method as claimed in claim 10, wherein the step of forming the conductive electrode comprises forming the conductive electrode to conform to a shape of the ridge structure within the first region.

18. The method as claimed in claim 10, wherein the step of forming the conductive electrode comprises forming the conductive electrode to contact the heat sink within the first region.

* * * * *